(12) United States Patent
Fukuda

(10) Patent No.: US 12,538,664 B2
(45) Date of Patent: Jan. 27, 2026

(54) DISPLAY DEVICE

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 377 days.

(21) Appl. No.: 18/169,882

(22) Filed: Feb. 16, 2023

(65) Prior Publication Data

US 2023/0269971 A1    Aug. 24, 2023

(30) Foreign Application Priority Data

Feb. 18, 2022 (JP) .................................. 2022-023942

(51) Int. Cl.
*H10K 59/122* (2023.01)
*H10K 59/35* (2023.01)
*H10K 59/80* (2023.01)

(52) U.S. Cl.
CPC ..... *H10K 59/122* (2023.02); *H10K 59/80515* (2023.02); *H10K 59/80523* (2023.02); *H10K 59/35* (2023.02)

(58) Field of Classification Search
CPC ........................... H10K 59/8723; H10K 59/35
See application file for complete search history.

(56) References Cited

U.S. PATENT DOCUMENTS

| | | | | |
|---|---|---|---|---|
| 2004/0160170 A1* | 8/2004 | Sato | ..................... | H10K 50/828 313/504 |
| 2009/0009069 A1* | 1/2009 | Takata | ................. | H10K 50/824 445/24 |
| 2012/0104423 A1* | 5/2012 | Kurata | ................... | H05B 33/28 257/40 |
| 2014/0191202 A1* | 7/2014 | Shim | ..................... | H10K 50/852 257/40 |

(Continued)

FOREIGN PATENT DOCUMENTS

| | | |
|---|---|---|
| JP | 2000-195677 A | 7/2000 |
| JP | 2004-207217 A | 7/2004 |

(Continued)

OTHER PUBLICATIONS

Galca et al, "Optical properties of amorphous-like indium zinc oxide and indium gallium zinc oxide thin films", 2012, Thin Solid Films 520, 2012, pp. 4722-4725 (Year: 2012).*

(Continued)

*Primary Examiner* — Bumsuk Won
(74) *Attorney, Agent, or Firm* — XSENSUS LLP

(57) ABSTRACT

According to one embodiment, a display device includes a lower electrode, a rib covering a part of the lower electrode and including an aperture that overlaps with the lower electrode, a partition including a lower portion on the rib and an upper portion protruding from a side surface of the lower portion, an upper electrode opposed to the lower electrode, and an organic layer located between the lower and upper electrodes. The upper electrode includes a first layer cover- (Continued)

ing the organic layer and a second layer covering the first layer. The second layer is in contact with the side surface of the lower portion.

11 Claims, 9 Drawing Sheets

(56) References Cited

U.S. PATENT DOCUMENTS

| | | | |
|---|---|---|---|
| 2015/0102305 A1* | 4/2015 | Jung | H10K 50/82 257/40 |
| 2015/0364525 A1* | 12/2015 | Lin | H10K 59/351 257/40 |
| 2019/0363275 A1 | 11/2019 | Ochi et al. | |
| 2023/0209905 A1* | 6/2023 | Kwon | H10K 59/1315 257/40 |
| 2023/0413618 A1* | 12/2023 | Fang | H10K 59/126 |
| 2024/0224584 A1* | 7/2024 | Gao | H10K 50/11 |

FOREIGN PATENT DOCUMENTS

| | | |
|---|---|---|
| JP | 2008-135325 A | 6/2008 |
| JP | 2009-32673 A | 2/2009 |
| JP | 2010-118191 A | 5/2010 |
| WO | 2018/179308 A1 | 10/2018 |

OTHER PUBLICATIONS

Malathy et al, "Amorphous to crystalline transition and optoelectronic properties of nanocrystalline indium tin oxide (ITO) films sputtered with high rf power at room temperature", Journal of Non-Crystalline Solids 355, 2009, pp. 1508-1516 (Year: 2009).*

Tchenka et al, "Effect of RF Sputtering Power and Deposition Time on Optical and Electrical Properties of Indium Tin Oxide Thin Film", Advances in Materials Science and Engineering vol. 2021, Article ID 5556305 (Year: 2021).*

* cited by examiner

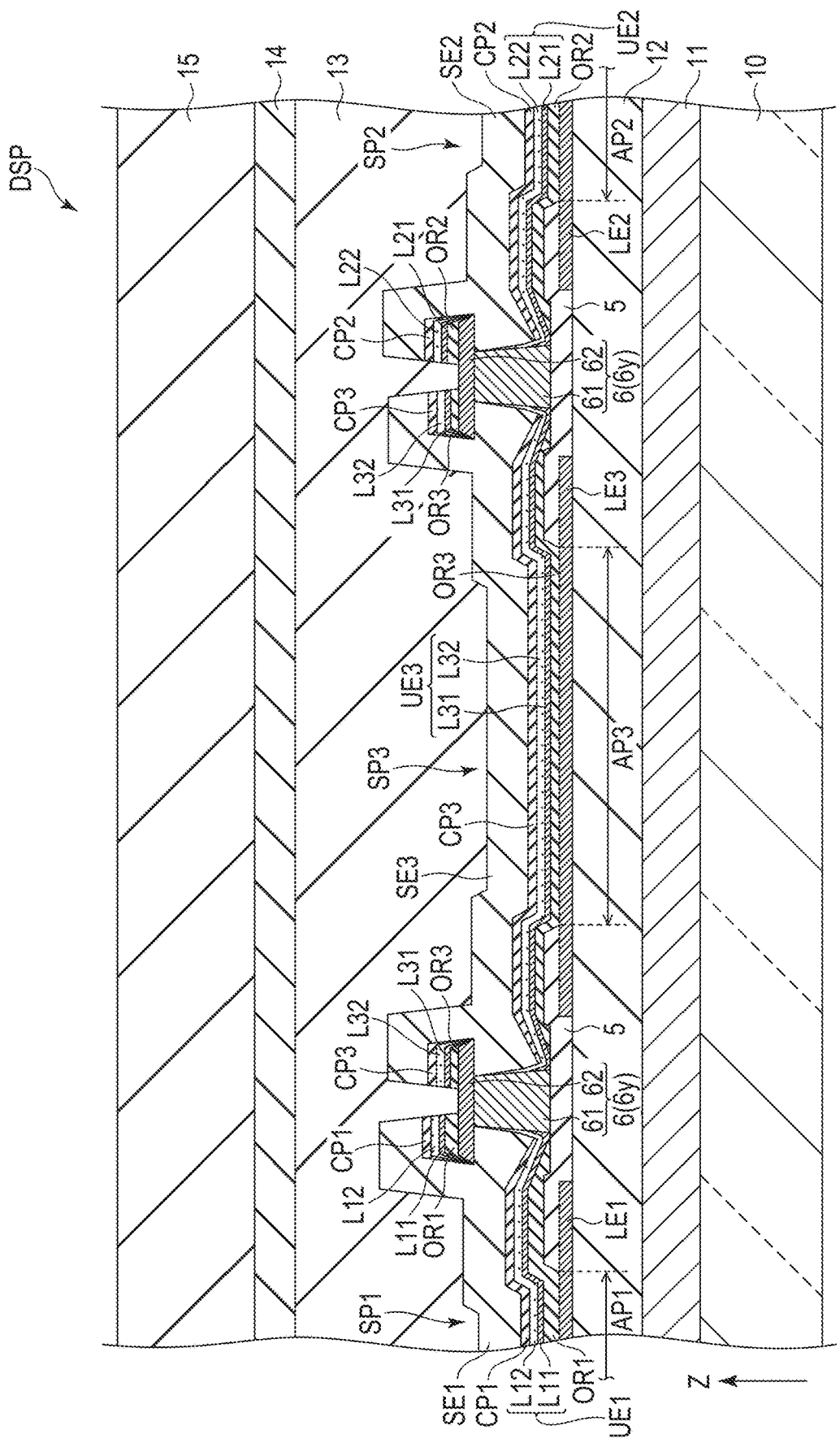
F I G. 3

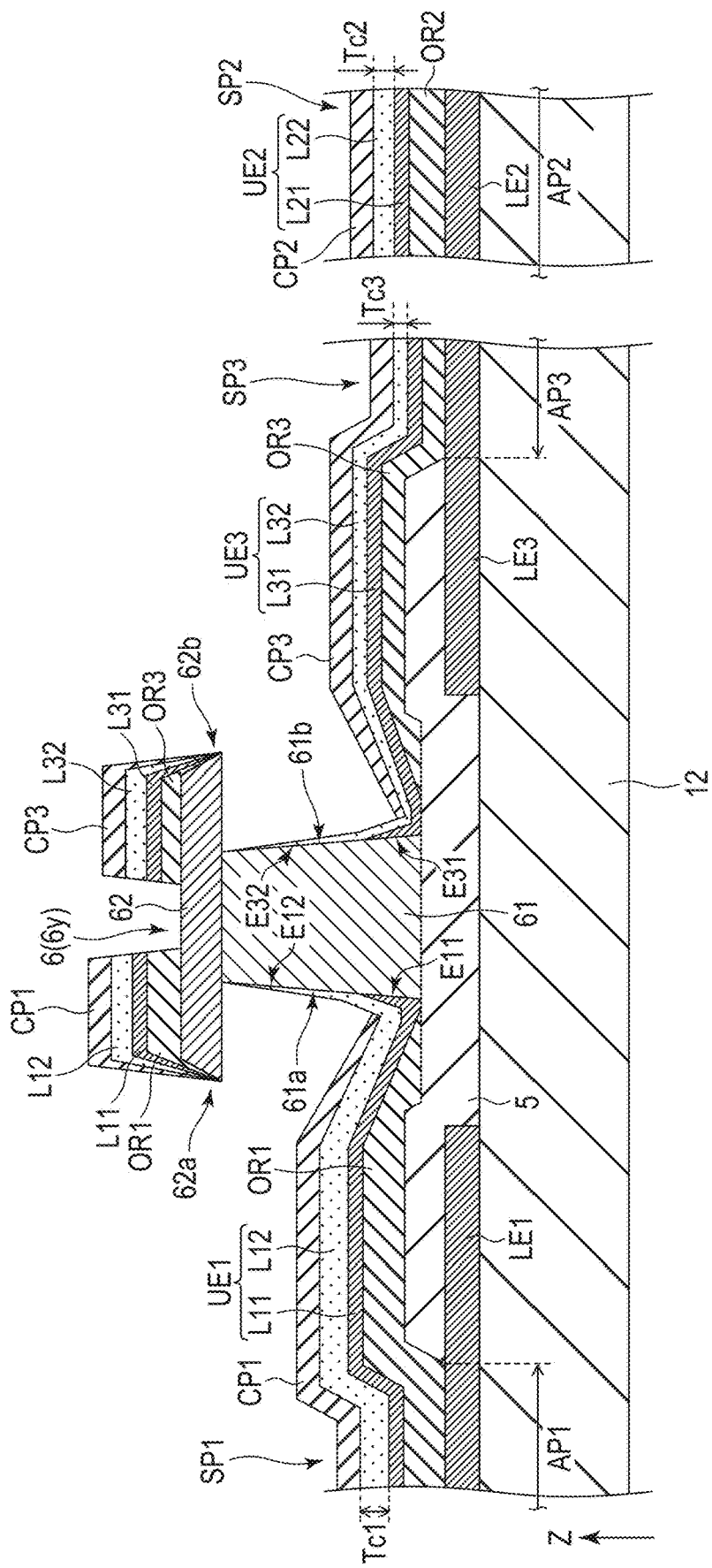
F I G. 5

DISPLAY DEVICE

CROSS-REFERENCE TO RELATED APPLICATIONS

This application is based upon and claims the benefit of priority from Japanese Patent Application No. 2022-023942, filed Feb. 18, 2022, the entire contents of which are incorporated herein by reference.

FIELD

Embodiments described herein relate generally to a display device.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer.

A technique for improving the reliability is required for the display device.

BRIEF DESCRIPTION OF THE DRAWINGS

FIG. 3 is a schematic cross-sectional view showing the display device taken along line III-III in FIG. 2.

FIG. 5 is a schematic cross-sectional view showing another example of the configuration applicable to the display device.

DETAILED DESCRIPTION

In general, according to one embodiment, a display device comprises: a lower electrode; a rib covering a part of the lower electrode and including an aperture that overlaps with the lower electrode; a partition including a lower portion arranged on the rib and an upper portion protruding from a side surface of the lower portion; an upper electrode opposed to the lower electrode; and an organic layer located between the lower electrode and the upper electrode to emit light in accordance with a potential difference between the lower electrode and the upper electrode. The upper electrode includes a first layer covering the organic layer and a second layer covering the first layer. The second layer is in contact with the side surface of the lower portion.

According to this configuration, a display device capable of improving the reliability can be provided.

One of embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. To more clarify the explanations, the drawings may pictorially show width, thickness, shape and the like of each portion as compared with actual embodiments, but they are mere examples and do not restrict the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. Viewing various elements parallel to the third direction Z is referred to as planar view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

Figure 1:
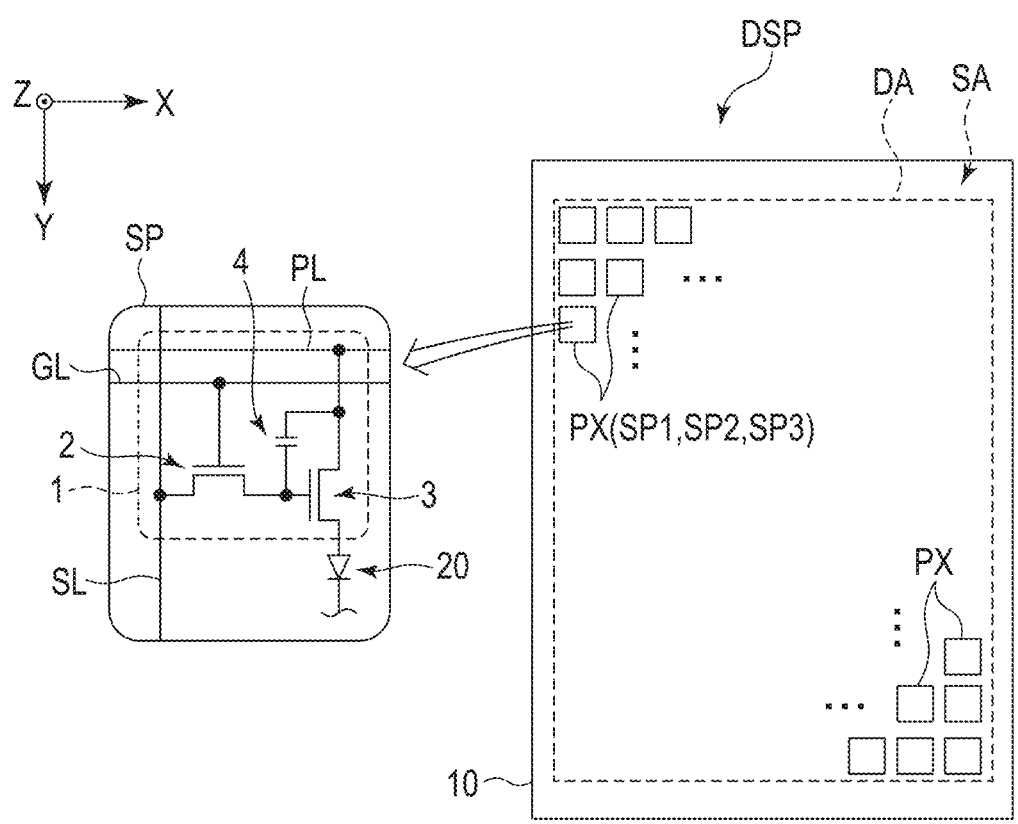
FIG. 1 is a view showing a configuration example of a display device according to one of embodiments.

FIG. 1 is a plan view showing a configuration example of a display device DSP according to the embodiment. The display device DSP has a display area DA where images are displayed and a surrounding area SA around the display area DA, on an insulating substrate 10. The substrate 10 may be glass or a flexible resin film.

In the embodiment, the shape of the substrate 10 in planar view is a rectangular shape. However, the shape of the substrate 10 in planar view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. For example, the pixel PX comprises a red sub-pixel SP1, a green sub-pixel SP2, and a blue sub-pixel SP3. The pixel PX may include sub-pixels SP of other colors such as a white color together with the sub-pixels SP1, SP2, and SP3 or instead of any of the sub-pixels SP1, SP2, and SP3. In addition, combination of the colors of the sub-pixels SP may be a combination other than red, green, and blue, and the number of sub-pixels SP corresponding to one pixel may be two or may be four or more.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element 20.

The configuration of the pixel circuit 1 is not limited to the example shown in the figure. For example, the pixel circuit 1 may comprise more thin-film transistors and capacitors.

The display element 20 is an organic light-emitting diode (OLED) serving as a light emitting element. For example, the sub-pixel SP1 comprises a display element 20 that emits light of a red wavelength range, the sub-pixels SP2 comprises a display element 20 that emits light of a green wavelength range, and the sub-pixels SP3 comprises a display element 20 that emits light of a blue wavelength range.

Figure 2:
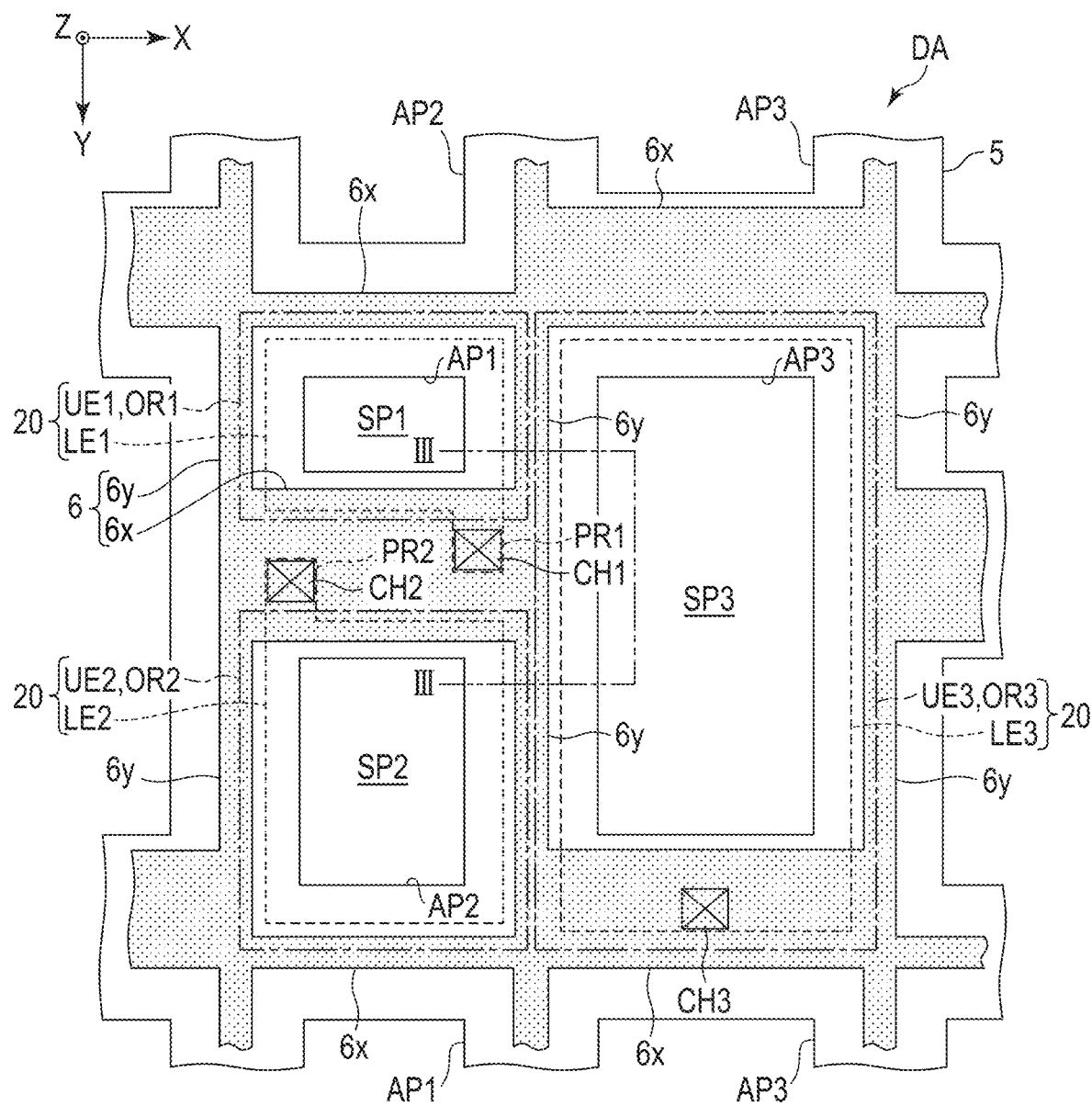
FIG. 2 is a view showing an example of layout of sub-pixels.

FIG. 2 is a view showing an example of a layout of the sub-pixels SP1, SP2, and SP3. In the example of FIG. 2, the sub-pixels SP1 and SP2 are arranged in the second direction Y. Furthermore, each of the sub-pixels SP1 and SP2 is arranged with the sub-pixels SP3 in the first direction X.

When the sub-pixels SP1, SP2, and SP3 are arranged in such a layout, a row in which the sub-pixels SP1 and SP2 are alternately arranged in the second direction Y and a row in which a plurality of sub-pixels SP3 are repeatedly arranged in the second direction Y are formed in the display area DA. These rows are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is greater than the aperture AP1, and the aperture AP3 is greater than the aperture AP2.

The partition 6 is arranged at a boundary of adjacent sub-pixels SP and overlaps with the rib 5 in planar view. The partition 6 includes a plurality of first partitions 6x extending in the first direction X and a plurality of second partitions 6y extending in the second direction Y. The plurality of first partitions 6x are located between the apertures AP1 and AP2 adjacent in the second direction Y and between two apertures AP3 adjacent in the second direction Y. The second partitions 6y are located between the apertures AP1 and AP3 adjacent in the first direction X and between the apertures AP2 and AP3 adjacent in the first direction X.

In the example in FIG. 2, the first partitions 6x and the second partitions 6y are connected to each other. Thus, the partition 6 has a grating pattern surrounding the apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the aperture AP1. The sub-pixel SP2 comprises a lower electrode LE2, an upper electrode UE2, and an organic layer OR2 each overlapping with the aperture AP2. The sub-pixel SP3 comprises a lower electrode LE3, an upper electrode UE3, and an organic layer OR3 each overlapping with the aperture AP3. In the example shown in FIG. 2, outer shapes of the upper electrode UE1 and the organic layer OR1 correspond to each other, outer shapes of the upper electrode UE2 and the organic layer OR2 correspond to each other, and outer shapes of the upper electrode UE3 and the organic layer OR3 correspond to each other.

The lower electrode LE1, the upper electrode UE1, and the organic layer OR1 constitute the display element 20 of the sub-pixel SP1. The lower electrode LE2, the upper electrode UE2, and the organic layer OR 2 constitute the display element 20 of the sub-pixel SP2. The lower electrode LE3, the upper electrode UE3, and the organic layer OR3 constitute the display element 20 of the sub-pixel SP3.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

In the example of FIG. 2, the contact holes CH1 and CH2 entirely overlap with the first partition 6x between the apertures AP1 and AP2 adjacent in the second direction Y. The contact hole CH3 entirely overlaps with the first partition 6x between two apertures AP3 adjacent in the second direction Y. As the other example, at least parts of the contact holes CH1, CH2, and CH3 may not overlap with the first partition 6x.

In the example in FIG. 2, the lower electrodes LE1 and LE2 include protrusions PR1 and PR2, respectively. The protrusion PR1 protrudes from a main body of the lower electrode LE1 (portion overlapping with the aperture AP1) toward the contact hole CH1. The protrusion PR2 protrudes from a main body of the lower electrode LE2 (portion overlapping with the aperture AP2) toward the contact hole CH2. The contact holes CH1 and CH2 overlap with the protrusions PR1 and PR2, respectively.

FIG. 3 is a schematic cross-sectional view showing the display device DSP taken along line III-III in FIG. 2. A circuit layer 11 is arranged on the substrate 10 described above. The circuit layer 11 includes various circuits and lines such as the pixel circuits 1, the scanning lines GL, the signal lines SL and the power lines PL shown in FIG. 1. The circuit layer 11 is covered with an insulating layer 12. The insulating layer 12 functions as a planarization film for planarizing uneven parts generated by the circuit layer 11. Although not shown in the cross section of FIG. 3, the contact holes CH1, CH2, and CH3 are provided in the insulating layer 12.

The lower electrodes LE1, LE2, and LE3 are arranged on the insulating layer 12. The rib 5 is arranged on the insulating layer 12 and the lower electrodes LE1, LE2, and LE3. End parts of the lower electrodes LE1, LE2, and LE3 are covered with the rib 5.

The partition 6 includes a lower portion 61 arranged on the rib 5 and an upper portion 62 that covers an upper surface of the lower portion 61. The upper portion 62 has a width greater than the lower portion 61. As a result, both the end parts of the upper 62 protrude beyond the side surfaces of the lower portion 61 in FIG. 3. The shape of the partition 6 may also be referred to as an overhanging shape.

The organic layer OR1 covers the lower electrode LE1 through the aperture AP1. The upper electrode UE1 is opposed to the lower electrode LE1. In the embodiment, the upper electrode UE1 includes a first layer L11 covering the organic layer OR1 and a second layer L12 covering the first layer L11. The first layer L11 and the second layer L12 are in contact with the lower portion 61. A cap layer CP1 is arranged on the second layer L12.

The organic layer OR2 covers the lower electrode LE2 through the aperture AP2. The upper electrode UE2 is opposed to the lower electrode LE2. In the embodiment, the upper electrode UE2 includes a first layer L21 covering the organic layer OR2 and a second layer L22 covering the first layer L21. The first layer L21 and the second layer L22 are in contact with the lower portion 61. A cap layer CP2 is arranged on the second layer L22.

The organic layer OR3 covers the lower electrode LE3 through the aperture AP3. The upper electrode UE3 is opposed to the lower electrode LE3. In the embodiment, the upper electrode UE3 includes a first layer L31 covering the organic layer OR3 and a second layer L32 covering the first layer L31. The first layer L31 and the second layer L32 are in contact with the lower portion 61. A cap layer CP3 is arranged on the second layer L32.

Parts of the organic layer OR1, the first layer L11, the second layer L12, and the cap layer CP1 are located on the upper portion 62. The parts are separated from the other parts of the organic layer OR1, the first layer L11, the second layer L12, and the cap layer CP1. Similarly, parts of the organic layer OR2, the first layer L21, the second layer L22, and the cap layer CP2 are located on the upper portion 62, and the parts are separated from the other parts of the organic layer OR2, the first layer L21, the second layer L22, and the cap layer CP2. Furthermore, parts of the organic layer OR3, the first layer L31, the second layer L32, and the cap layer CP3 are located on the upper portion 62, and the parts are separated from the other parts of the organic layer OR3, the first layer L31, the second layer L32, and the cap layer CP3.

Sealing layers SE1, SE2, and SE3 are arranged in the sub-pixels SP1, SP2, and SP3, respectively. The sealing layer SE1 continuously covers the cap layer CP1 and the partition 6. The sealing layer SE2 continuously covers the cap layer CP2 and the partition 6. The sealing layer SE3 continuously covers the cap layer CP3 and the partition 6.

In the example in FIG. 3, the organic layer OR1, the first layer L11, the second layer L12, the cap layer CP1, and the sealing layer SE1 on the partition 6 between the sub-pixels SP1 and SP3 are separated from the organic layer OR3, the first layer L31, the second layer L32, the cap layer CP3, and the sealing layer SE3 on the partition 6. In addition, the organic layer OR2, the first layer L21, the second layer L22, the cap layer CP2, and the sealing layer SE2 on the partition 6 between the sub-pixels SP2 and SP3 are separated from the organic layer OR3, the first layer L31, the second layer L32, the cap layer CP3, and the sealing layer SE3 on the partition 6.

The sealing layers SE1, SE2, and SE3 are covered with a resin layer 13. The resin layer 13 is covered with a sealing layer 14. Furthermore, the sealing layer 14 is covered with a resin layer 15.

The insulating layer 12 and the resin layers 13 and 15 are formed of an organic material. The rib 5 and the sealing layers 14, SE1, SE2, and SE3 are formed of, for example, an inorganic material such as silicon nitride (SiNx).

The lower portion 61 of the partition 6 is formed of, for example, a metallic material such as molybdenum (Mo) and is conductive. The lower portion 61 may have a multilayer structure of the same metallic material or different metallic materials. The upper portion 62 of the partition 6 may also be conductive. The lower electrodes LE1, LE2, and LE3 may be formed of a transparent conductive oxide such as indium tin oxide (ITO) or may have a multilayer structure of a metallic material such as silver (Ag) and a conductive oxide.

The first layers L11, L21, and L31 are formed of, for example, a metallic material such as an alloy (MgAg) containing magnesium and silver. The second layers L12, L22, and L32 are formed of, for example, a transparent conductive oxide such as ITO, indium zinc oxide (IZO) or indium gallium zinc oxide (IGZO).

The cap layers CP1, CP2, and CP3 are formed of a material having a smaller refractive index than that of the second layers L12, L22, and L32. As an example, the cap layers CP1, CP2, and CP3 can be formed of lithium fluoride (LiF). The cap layers CP1, CP2, and CP3 may be multilayer bodies in which a plurality of materials having different refractive indices are stacked. At least one of the cap layers CP1, CP2, and CP3 may be omitted.

When potentials of the lower electrodes LE1, LE2, and LE3 are relatively higher than those of the upper electrodes UE1, UE2, and UE3, the lower electrodes LE1, LE2, and LE3 correspond to anodes, and the upper electrodes UE1, UE2, and UE3 correspond to cathodes. In addition, when the potentials of the upper electrodes UE1, UE2, and UE3 are relatively higher than those of the lower electrodes LE1, LE2, and LE3, the upper electrodes UE1, UE2, and UE3 correspond to anodes, and the lower electrodes LE1, LE2, and LE3 correspond to cathodes.

The organic layers OR1, OR2, and OR3 include a pair of functional layers and a light emitting layer interposed between these functional layers. As an example, each of the organic layers OR1, OR2, and OR3 includes a structure in which a hole-injection layer, a hole-transport layer, an electron blocking layer, a light emitting layer, a hole blocking layer, an electron-transport layer, and an electron-injection layer are stacked in this order.

A common voltage is supplied to the partition 6. This common voltage is supplied to each of the upper electrodes UE1, UE2, and UE3 that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the light emitting layer of the organic layer OR1 emits light of the red wavelength range. When a potential difference is formed between the lower electrode LE2 and the upper electrode UE2, the light emitting layer of the organic layer OR2 emits light of the green wavelength range. When a potential difference is formed between the lower electrode LE3 and the upper electrode UE3, the light emitting layer of the organic layer OR3 emits light of the blue wavelength range.

As another example, the light emitting layers of the organic layers OR1, OR2, and OR3 may emit light of the same color (for example, white). In this case, the display device DSP may comprise color filters that convert the light emitted from the light emitting layers into light of the colors corresponding to the sub-pixels SP1, SP2, and SP3. In addition, the display device DSP may comprise a layer including quantum dots that are excited by the light emitted from the light emitting layers and generate the light of the colors corresponding to the sub-pixels SP1, SP2, and SP3.

Figure 4:
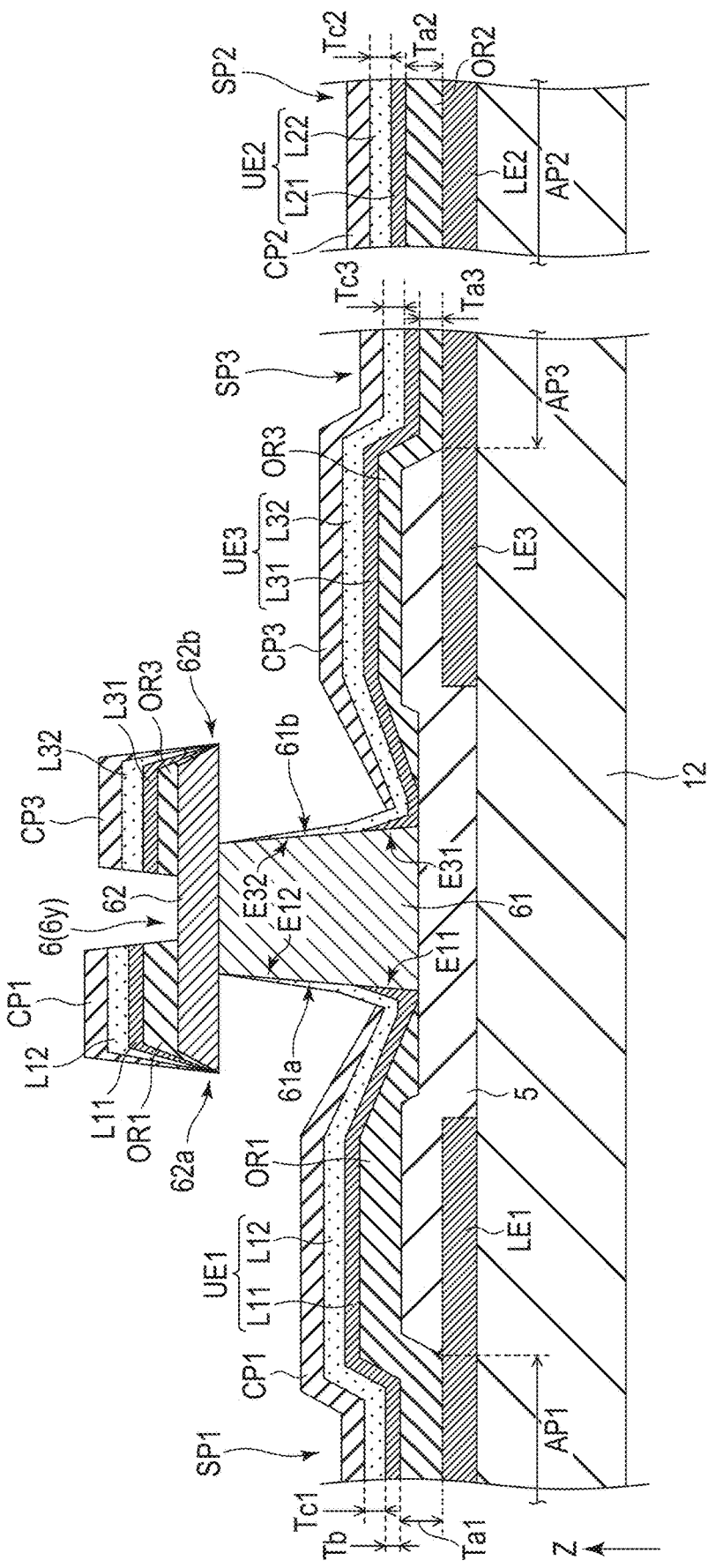
FIG. 4 is a schematic enlarged cross-sectional view showing a part of FIG. 3.

FIG. 4 is a schematic enlarged cross-sectional view showing a part of FIG. 3. In this figure, the vicinity of the partition 6 arranged on a boundary between the sub-pixels SP1 and SP3, and a part of the sub-pixel SP2 are shown, but illustration of the substrate 10, the circuit layer 11, the sealing layers SE1, SE2, and SE3, the resin layer 13, the sealing layer 14, and the sealing layer 15 is omitted.

The lower portion 61 of the partition 6 has a pair of side surfaces 61a and 61b. The upper portion 62 of the partition 6 includes an end portion 62a further protruding than the side surface 61a and an end portion 62b further protruding than the side surface 61b.

An end portion E11 of the first layer L11 of the upper electrode UE1 is in contact with a lower area of the side surface 61a. The second layer L12 of the upper electrode UE1 covers the end portion E11. An end portion E12 of the second layer L12 is in contact with an area upper than the area with which the end portion E11 is in contact.

Similarly, an end portion E31 of the first layer L31 of the upper electrode UE3 is in contact with a lower area of the side surface 61b. The second layer L32 of the upper electrode UE3 covers the end portion E31. An end portion E32 of the second layer L32 is in contact with an area upper than the area with which the end portion E31 is in contact.

Although not shown in the cross section in FIG. 4, shapes of the end portion of the first layer L21 and the end portion of the second layer L22 of the upper electrode UE2 are similar to the shapes of the end portions E11 and E31 of the first layers L11 and L31 and the end portions E12 and E32 of the second layers L12 and L32, respectively.

In the example in FIG. 4, the lower surface of the upper portion 62 is not covered with the second layers L12 and L32. As another example, the lower surface of the upper portion 62 may be covered with the second layers L12 and L32.

As described above, the refractive index of the cap layer CP1 is smaller than that of the second layer L12. The cap layer CP1 and the second layer L12 function as optical adjustment layers that improve the light outcoupling efficiency of the light emitted from the organic layer OR1. Similarly, the cap layer CP2 and the second layer L22 function as optical adjustment layers that improve the light outcoupling efficiency of the light emitted from the organic layer OR2, and the cap layer CP3 and the second layer L32 function as optical adjustment layers that improve the light outcoupling efficiency of the light emitted from the organic layer OR3.

The organic layer OR1 has a thickness Ta1 at the aperture AP1, the organic layer OR2 has a thickness Ta2 at the aperture AP2, and the organic layer OR3 has a thickness Ta3 at the aperture AP3. In the example in FIG. 4, the thicknesses Ta1, Ta2, and Ta3 are different from each other. More specifically, the thickness Ta2 is greater than the thickness Ta3, and the thickness Ta1 is greater than the thickness Ta2 (Ta3<Ta2<Ta1).

The first layers L11, L21, and L31 have the same thickness Tb at the apertures AP1, AP2, and AP3, respectively. As an example, the thickness Tb is 10 nm or more and 20 nm or less. As another example, the thickness of at least one of the first layers L11, L21, and L31 may be different from each other.

The second layer L12 has a thickness Tc1 at the aperture AP1, the second layer L22 has a thickness Tc2 at the aperture AP2, and the second layer L32 has a thickness Tc3 at the aperture AP3. These thicknesses Tc1, Tc2, and Tc3 are greater than the thickness Tb (Tb<Tc1, Tc2, and Tc3). In the example in FIG. 4, the thicknesses Tc1, Tc2, and Tc3 are the same as each other.

FIG. 5 is a schematic cross-sectional view showing another example of the configuration that can be applied to the display device DSP. In this figure, the thicknesses Tc1, Tc2, and Tc3 are different from each other.

More specifically, the thickness Tc2 is greater than the thickness Tc3, and the thickness Tc1 is greater than the thickness Tc2 (Tc3<Tc2<Tc1). Thus, a preferable light outcoupling efficiency according to the color (wavelength) of the light emitted from the organic layers OR1, OR2, and OR3 can be achieved by making the thicknesses of the second layers L12, L22, and L32 different.

All the thicknesses Tc1, Tc2, and Tc3 do not need to be different from each other. For example, the thicknesses Tc1 and Tc2 may be the same value which is greater than the thickness Tc3. In addition, the thicknesses Tc2 and Tc3 may be the same value which is smaller than the thickness Tc1.

In both FIG. 4 and FIG. 5, the second layers L12, L22, and L32 can be formed of the same material (conductive oxide). In one example, the second layers L12, L22, and L32 are all formed of ITO of the same quality.

As another example, at least one of the second layers L12, L22, and L32 can be formed of different materials. Since ITO is excellent in short wavelength transmittance, ITO is suitable for arrangement in the blue sub-pixel SP3. In contrast, when ITO is formed to be thick, processing by etching is difficult. In contrast, IZO is inferior to ITO in short wavelength transmittance, but can easily be processed by etching even when formed thickly. Therefore, the second layer L12 may be formed of IZO and the second layer L32 may be formed of ITO in the case where the thickness Tc1 is greater than the thickness Tc3 as shown in FIG. 5. The second layer L22 may be formed of IZO when processability is focused or may be formed of ITO when transmittance is focused.

As another example, the second layer L12 may be formed of amorphous ITO and the second layer L32 may be formed of ITO with higher crystallinity than the second layer L12. Amorphous ITO is inferior to highly crystalline ITO in short wavelength transmittance, but is excellent in processability by etching. For this reason, even when the thickness Tc1 is increased as shown in FIG. 5, patterning of the second layer L12 becomes easier by forming the second layer L12 of amorphous ITO. The second layer L22 may be formed of amorphous ITO when the processability is focused or may be formed of highly crystalline ITO when the transmittance is focused.

If the lower portion 61 is formed of aluminum, electric decoration may be generated by contact with the second layers L12, L22, and L32 formed of ITO. Therefore, it is desirable to form the lower portion 61 of molybdenum or the like as described above. The electric decoration caused by contact between the second layers L12, L22, and L32 and the lower portion 61 can be thereby suppressed.

Next, a method of manufacturing the display device DSP will be described.

FIG. 6 to FIG. 9 are schematic cross-sectional views mainly showing the processes of forming the display element 20, of the method of manufacturing the display device DSP. The sub-pixels SPα, SPβ, and SPγ shown in these figures correspond to any of the sub-pixels SP1, SP2, and SP3. In addition, lower electrode LEα, LEβ, and LEγ correspond to one of the lower electrodes LE1, LE2, and LE3, an organic layer ORα corresponds to one of the organic layers OR1, OR2, and OR3, an upper electrode UEα corresponds to one of the upper electrodes UE1, UE2, and UE3, a first layer Lα1 corresponds to one of the first layers L11, L21, and L31, a second layer Lα2 corresponds to one of the second layers L12, L22, and L32, a cap layer CPα corresponds to one of the cap layers CP1, CP2, and CP3, and a sealing layer SEα corresponds to one of the sealing layers SE1, SE2, and SE3.

Figure 6:
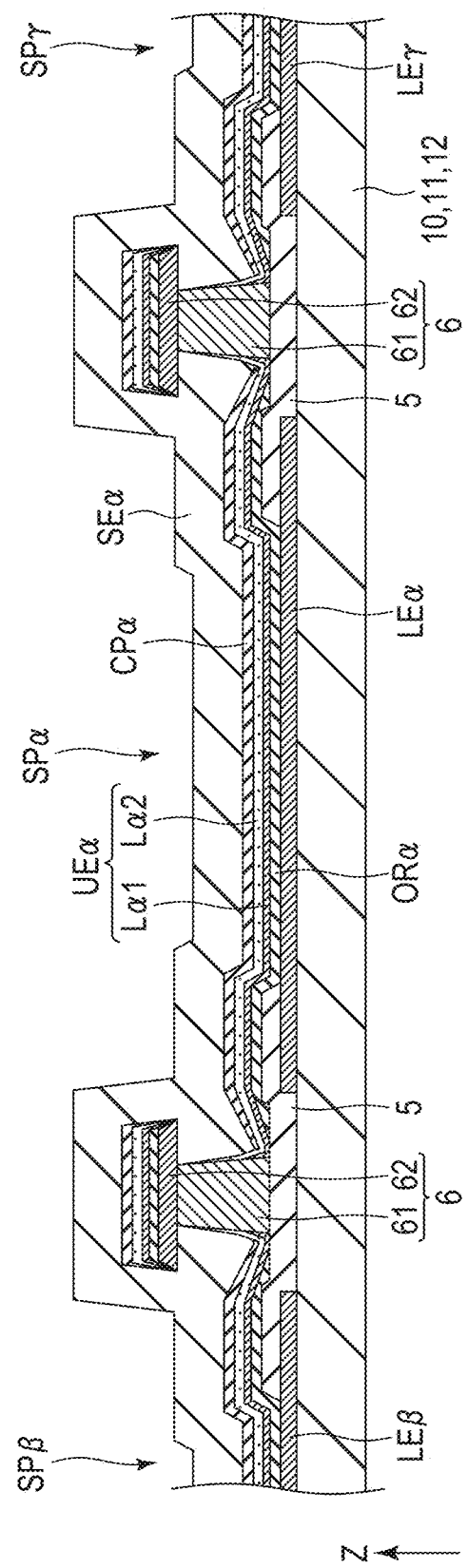
FIG. 6 is a schematic cross-sectional view showing a part of a manufacturing process of the display device.

After the bottom electrodes LEα, LEβ, and LEγ of the sub-pixels SPα, SPβ, and SPγ, the rib 5, and the partition 6 are formed on the insulating layer 12, the organic layer ORα, the upper electrode UEα (first layer Lα1 and second layer Lα2), the cap layer CPα, and the sealing layer SEα of the sub-pixel SPα are formed in order on the whole substrate as shown in FIG. 6. The organic layer ORα includes a light emitting layer that emits light of a color corresponding to the sub-pixel SPα. The organic layer ORα, the upper electrode UEα, and the cap layer CPα are divided into a portion located below the partition 6 and a portion located above the partition 6 by the overhanging partition 6.

The first layer Lα1 is formed by, for example, vapor deposition. The second layer Lα2 is formed by, for example, sputtering. Sputtering is excellent in diffraction characteristics during formation. For this reason, even when the height of the lower portion 61 is small or the protrusion of the upper portion 62 is large, the second layer Lα2 that is in desirable contact with the side surface of the lower portion 61 of the partition 6 can be formed.

Figure 7:
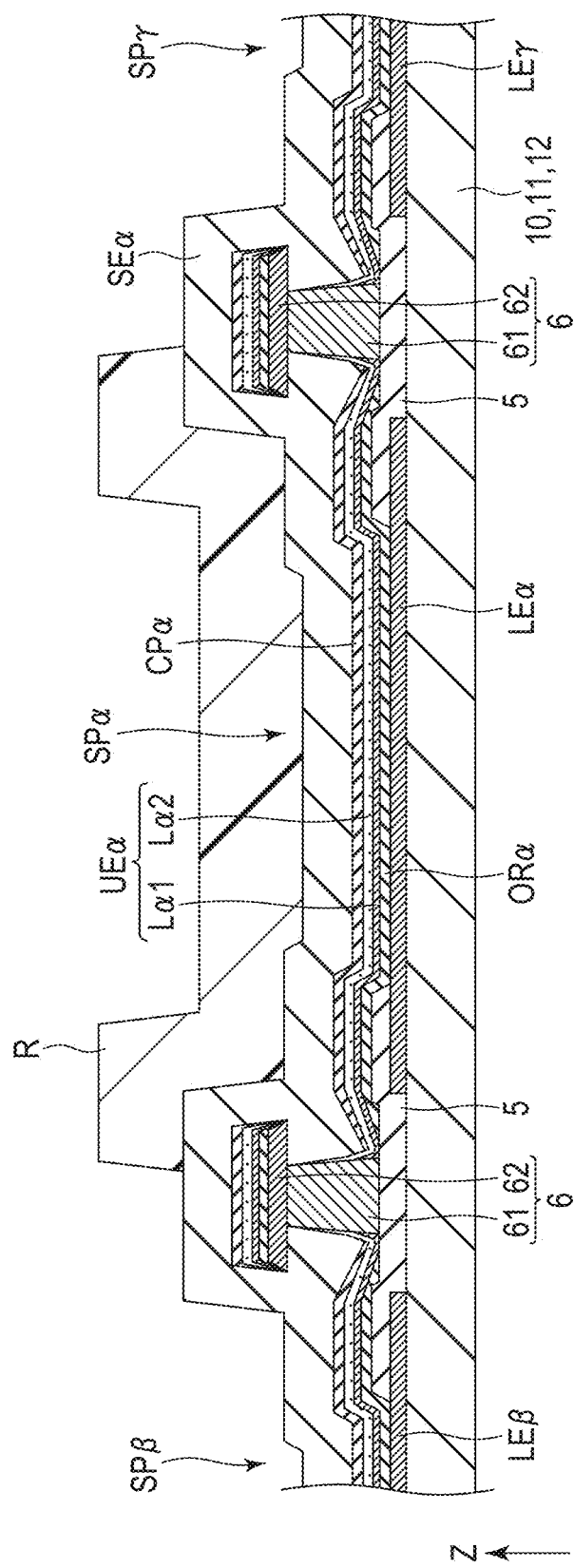
FIG. 7 is a schematic cross-sectional view showing a manufacturing process following FIG. 6.

Next, the resist R is formed on the sealing layer SEα as shown in FIG. 7. The resist R covers the sub-pixel SPα. In other words, the resist R is arranged directly above the organic layer ORα, the upper electrode UEα, and the cap layer CPα located in the sub-pixel SPα. The resist R is also located directly above the portion closer to the sub-pixel SPα among the organic layer ORα, the upper electrode UEα and the cap layer CPα on the two partitions 6 shown in the figure.

Figure 8:
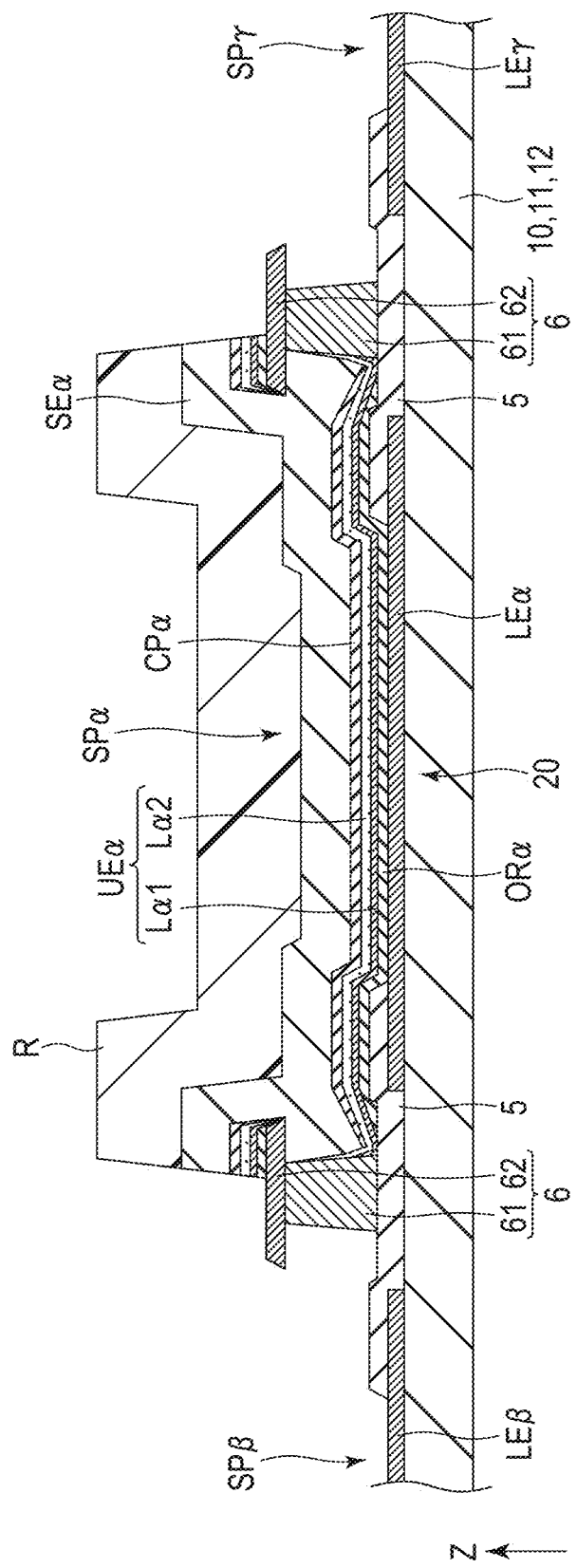
FIG. 8 is a schematic cross-sectional view showing a manufacturing process following FIG. 7.
Figure 9:
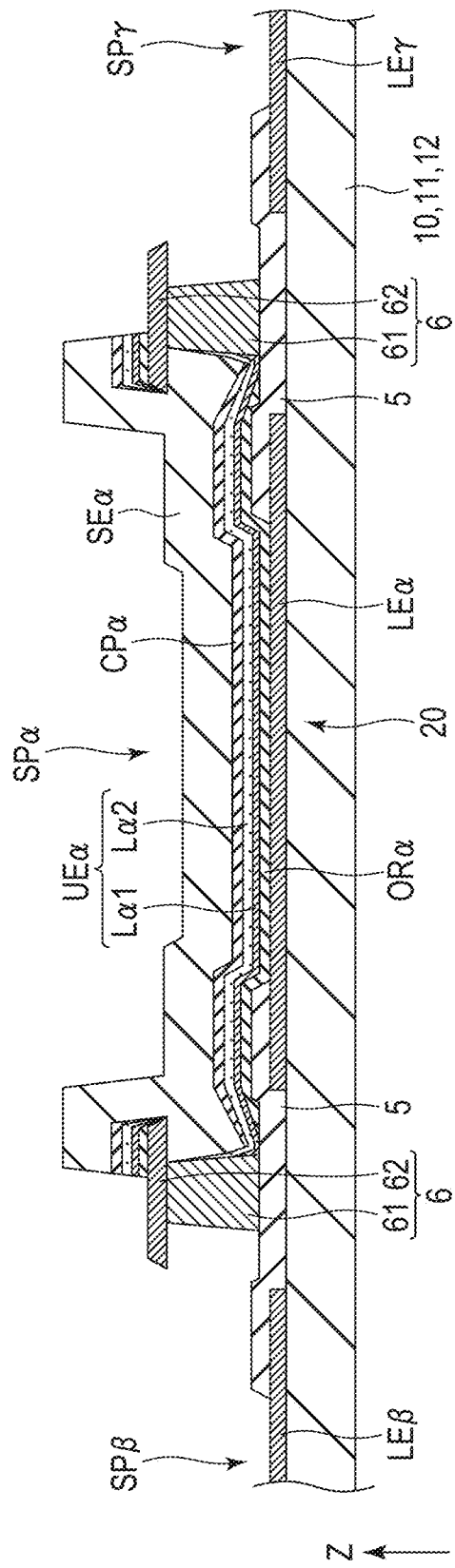
FIG. 9 is a schematic cross-sectional view showing a manufacturing process following FIG. 8.

After that, as shown in FIG. 8, portions of the organic layer ORα, the upper electrode UEα, the cap layer CPα, and the sealing layer SEα, which are exposed from the resist R, are removed by etching and ashing using the resist R as a mask. Furthermore, the resist R is removed as shown in FIG. 9. As a result, the display element 20 including the lower electrode LEα, the organic layer ORα, the upper electrode UEα, and the cap layer CPα is formed in the sub-pixel SPα. In contrast, the lower electrodes LEβ and LEγ are exposed in the sub-pixels SPβ and SPγ, respectively.

In a case where the rib 5 and the sealing layer SEα are formed of the same type of inorganic material such as silicon nitride, if the rib 5 is exposed during etching of the sealing layer SEα, the rib 5 may be damaged by the etching. In addition, the rib 5 may also be damaged by etching of the cap layer CPα.

In contrast, in the example of FIG. 7, the second layer Lα2 formed of a conductive oxide such as ITO is located below the sealing layer SEα and the cap layer CPα in each of the sub-pixels SPα, SPβ, and SPγ. For this reason, the second layer Lα2 functions as an etching stopper to suppress damage to the ribs 5.

After the display element 20 of the sub-pixel SPα is formed, the processes for forming the display elements 20 of the sub-pixels SPβ and SPγ are performed in order. These processes are the same as those described above for the sub-pixel SPα.

The display device DSP shown in FIG. 3 is completed by forming the display elements 20 of the sub-pixels SP1, SP2, and SP3 by the processes exemplified for the above-described sub-pixels SPα, SPβ, and SPγ and further forming the resin layer 13, the sealing layer 14, and the resin layer 15.

For example, in the cross section of FIG. 3, the end portions of the lower electrodes LE1, LE2, and LE3 are covered with the rib 5, and stepped portions are thereby formed on the upper surface of the rib 5. When the upper electrodes UE1, UE2, and UE3 are thinly formed single-layer structures formed of metallic materials such as alloys containing magnesium and silver, the upper electrodes UE1, UE2, and UE3 may be broken due to affect of the stepped portions. If such breakage occurs over a wide area, conduction between the upper electrodes UE1, UE2, and UE3 and the partition 6 cannot be secured.

In contrast, in this embodiment, the upper electrodes UE1, UE2, and UE3 are all formed of two conductive layers (first layers L11, L21, and L31 and second layers L12, L22, and L32). Preferable conduction between the upper electrodes UE1, UE2, and UE3 and the partition 6 can be secured as compared with a case where the upper electrodes UE1, UE2, and UE3 have a single-layer structure. As a result, the reliability of the display device DSP can be improved.

In the embodiment, the first layers L11, L21, and L31 are thinly formed of a metallic material such as an alloy containing magnesium and silver, and the second layers L12, L22, and L32 are thickly formed of a conductive oxide such as ITO. By thus thickly forming the second layers L12, L22, and L32, the breakage of the second layers L12, L22, and L32 can be suppressed even when stepped portions that cause breakage in the first layers L11, L21, and L31 exist.

In addition, in the configuration in which both the first layers L11, L21, and L31 and the second layers L12, L22, and L32 are in contact with the lower portion 61 of the partition 6 as shown in FIG. 4, a wide contact area of the upper electrodes UE1, UE2, and UE3 and the lower portion 61 can be secured.

Furthermore, by making the second layers L12, L22, and L32 serve as a part of the optical adjustment layer (low refractive index layer) as described above, the manufacturing costs can be reduced as compared with providing a separate low refractive index layer.

Besides this, various desirable advantages can be obtained in the embodiment.

All of the display devices and manufacturing methods that can be implemented by a person of ordinary skill in the art through arbitrary design changes to the display devices and manufacturing methods described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, the above embodiments with addition, deletion, and/or designed change of their structural elements by a person having ordinary skill in the art, or the above embodiments with addition, omission, and/or condition change of their processes by a person having ordinary skill in the art are encompassed by the scope of the present inventions without departing the spirit of the inventions.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
    a first sub-pixel including a first lower electrode, a first upper electrode opposed to the first lower electrode, and a first organic layer located between the first lower electrode and the first upper electrode to emit red light in accordance with a potential difference between the first lower electrode and the first upper electrode;
    a second sub-pixel including a second lower electrode, a second upper electrode opposed to the second lower electrode, and a second organic layer located between the second lower electrode and the second upper electrode to emit blue light in accordance with a potential difference between the second lower electrode and the second upper electrode;
    a rib covering a part of the first lower electrode and a part of the second lower electrode, and including a first aperture that overlaps with the first lower electrode and a second aperture that overlaps with the second lower electrode; and a partition including a lower portion arranged on the rib and an upper portion protruding from a side surface of the lower portion, wherein the first upper electrode and the second upper electrode each include a first layer and a second layer covering the first layer, an end portion of the first layer is in contact with the side surface of the lower portion, in each of the first upper electrode and the second upper electrode, the second layer covers the end portion of the first layer and is in contact with the side surface of the lower portion, in each of the first upper electrode and the second upper electrode, the first layer is formed of a metallic material and the second layer is formed of a conductive oxide, the second layer of the first upper electrode is thicker than the second layer of the second upper electrode, and a thickness of the first layer of the first upper electrode is identical to that of the second upper electrode.

2. The display device of claim 1, wherein
in each of the first upper electrode and the second upper electrode, the second layer is thicker than the first layer.

3. The display device of claim 1, wherein
in each of the first upper electrode and the second upper electrode, the first layer is formed of an alloy containing magnesium and silver.

4. The display device of claim 1, wherein
in each of the first upper electrode and the second upper electrode, the second layer is formed of ITO or IZO.

5. The display device of claim 1, wherein
the first sub-pixel includes a first cap layer covering the second layer of the first upper electrode, and
a refractive index of the first cap layer is smaller than a refractive index of the second layer of the first upper electrode.

6. The display device of claim 1, wherein
parts of the first organic layer, the first layer of the first upper electrode, and the second layer of the first upper electrode are located on the upper portion.

7. The display device of claim 1, wherein
the rib is formed of an inorganic material.

8. The display device of claim 1,
wherein
the second layer of the first upper electrode and the second layer of the second upper electrode are formed of different materials.

9. The display device of claim 8, wherein
the second layer of the first upper electrode is formed of IZO, and
the second layer of the second upper electrode is formed of ITO.

10. The display device of claim 8, wherein
the second layer of the first upper electrode is formed of ITO, and
the second layer of the second upper electrode is formed of ITO having higher crystallinity than the second layer of the first upper electrode.

11. The display device of claim 1, wherein
the first organic layer of the first sub-pixel is thicker than the second organic layer of the second sub-pixel.

* * * * *